United States Patent
Chang et al.

(10) Patent No.: US 11,515,241 B2
(45) Date of Patent: Nov. 29, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yung-Shun Chang, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/203,512

(22) Filed: Mar. 16, 2021

(65) Prior Publication Data

US 2021/0210420 A1 Jul. 8, 2021

Related U.S. Application Data

(63) Continuation of application No. 16/427,193, filed on May 30, 2019, now Pat. No. 10,950,531.

(51) Int. Cl.
*H05K 1/02* (2006.01)
*H01L 23/498* (2006.01)
(Continued)

(52) U.S. Cl.
CPC ...... *H01L 23/49822* (2013.01); *H01L 21/481* (2013.01); *H01L 21/4853* (2013.01);
(Continued)

(58) Field of Classification Search
CPC ............. H01L 23/49822; H01L 21/481; H01L 21/4857; H01L 21/6835; H01L 23/49838;
(Continued)

(56) References Cited

U.S. PATENT DOCUMENTS

| 8,017,436 B1* | 9/2011 | Huemoeller | ...... H01L 23/49861 |
| | | | 438/107 |
| 2002/0056192 A1* | 5/2002 | Suwa | ................... H05K 3/4644 |
| | | | 29/831 |

(Continued)

OTHER PUBLICATIONS

Corrected Notice of Allowability for U.S. Appl. No. 16/427,193, dated Dec. 18, 2020, 6 pages.

(Continued)

*Primary Examiner* — Steven T Sawyer
(74) *Attorney, Agent, or Firm* — Foley & Lardner LLP

(57) ABSTRACT

A semiconductor device package includes a first dielectric layer, a conductive pad and an electrical contact. The first dielectric layer has a first surface and a second surface opposite to the first surface. The conductive pad is disposed within the first dielectric layer. The conductive pad includes a first conductive layer and a barrier. The first conductive layer is adjacent to the second surface of the first dielectric layer. The first conductive layer has a first surface facing the first surface of the first dielectric layer and a second surface opposite to the first surface. The second surface of the first conductive layer is exposed from the first dielectric layer. The barrier layer is disposed on the first surface of the first conductive layer. The electrical contact is disposed on the second surface of the first conductive layer of the conductive pad.

18 Claims, 11 Drawing Sheets

(51) Int. Cl.
  *H01L 21/48* (2006.01)
  *H01L 21/683* (2006.01)
  *H05K 1/11* (2006.01)

(52) U.S. Cl.
  CPC ...... *H01L 21/4857* (2013.01); *H01L 21/6835* (2013.01); *H01L 23/49838* (2013.01); *H05K 1/0298* (2013.01); *H05K 1/113* (2013.01); *H01L 2221/68359* (2013.01)

(58) Field of Classification Search
  CPC ....... H01L 21/4853; H01L 2221/68359; H01L 23/49816; H01L 23/49811; H01L 2221/68345; H01L 23/3128; H01L 21/561; H01L 23/488; H05K 1/0268; H05K 1/09; H05K 3/064; H05K 3/467; H05K 3/4644; H05K 1/113; H05K 1/0298
  See application file for complete search history.

(56) References Cited

U.S. PATENT DOCUMENTS

| | | | |
|---|---|---|---|
| 2003/0104183 A1 | 6/2003 | Narizuka et al. | |
| 2009/0288872 A1* | 11/2009 | Kim | H05K 3/462 |
| | | | 174/262 |
| 2010/0243300 A1 | 9/2010 | Amin et al. | |
| 2010/0323474 A1 | 12/2010 | Miyazaki | |
| 2011/0317385 A1* | 12/2011 | Zhou | H01L 24/03 |
| | | | 361/771 |
| 2012/0066902 A1* | 3/2012 | Kim | H05K 3/427 |
| | | | 29/852 |
| 2012/0222894 A1 | 9/2012 | Kaneko et al. | |
| 2013/0134127 A1 | 5/2013 | Kodani et al. | |
| 2014/0090880 A1* | 4/2014 | Chen | H01L 23/49811 |
| | | | 174/257 |
| 2014/0091473 A1 | 4/2014 | Len et al. | |
| 2014/0339699 A1 | 11/2014 | Arvin et al. | |
| 2015/0156883 A1* | 6/2015 | Bong | H05K 3/4007 |
| | | | 174/266 |
| 2015/0208504 A1* | 7/2015 | Hou | H05K 1/0298 |
| | | | 174/261 |
| 2016/0242285 A1 | 8/2016 | Katsuno et al. | |
| 2017/0207186 A1* | 7/2017 | Uemura | C22C 13/00 |
| 2017/0372997 A1* | 12/2017 | Tsukamoto | H01L 21/4857 |
| 2018/0138115 A1 | 5/2018 | Lu | |
| 2019/0059153 A1* | 2/2019 | Liu | H05K 3/4676 |
| 2019/0267350 A1 | 8/2019 | Tajima et al. | |

OTHER PUBLICATIONS

Final Office Action for U.S. Appl. No. 16/427,193, dated Mar. 3, 2020, 16 pages.
Non-Final Office Action for U.S. Appl. No. 16/427,193, dated Jul. 22, 2020, 19 pages.
Non-Final Office Action for U.S. Appl. No. 16/427,193, dated Nov. 20, 2019, 14 pages.
Notice of Allowance for U.S. Appl. No. 16/427,193, dated Nov. 16, 2020, 6 pages.

* cited by examiner

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 16/427,193 filed May 30, 2019, the contents of which is incorporated herein by reference in its entirety.

BACKGROUND

1. Technical Field

The present disclosure relates generally to a semiconductor device package and a method of manufacturing the same, and to a semiconductor device package including a soldering pad structure and a method of manufacturing the same.

2. Description of the Related Art

A semiconductor package device may include solder balls that electrically connect an electronic component to a substrate. In a comparative semiconductor package device, solder balls may be directly bonded to copper pads. However, an intermetallic compound (IMC) layer may be formed between the solder balls and the copper pads, which may lead to a crack or void and in turn affect the connection between the solder balls and the copper pads.

SUMMARY

In one or more embodiments, a semiconductor device package includes a first dielectric layer, a conductive pad and an electrical contact. The first dielectric layer has a first surface and a second surface opposite to the first surface. The conductive pad is disposed within the first dielectric layer. The conductive pad includes a first conductive layer and a barrier. The first conductive layer is adjacent to the second surface of the first dielectric layer. The first conductive layer has a first surface facing the first surface of the first dielectric layer and a second surface opposite to the first surface. The second surface of the first conductive layer is exposed from the first dielectric layer. The barrier layer is disposed on the first surface of the first conductive layer. The electrical contact is disposed on the second surface of the first conductive layer of the conductive pad.

In one or more embodiments, a method of manufacturing a semiconductor device package includes (a) proving a carrier; (b) forming a first dielectric layer on the carrier, the first dielectric layer having an opening penetrating the first dielectric layer; (c) forming a first conductive layer within the opening; (d) forming a barrier layer within the opening and on the first conductive layer; and (e) forming an interconnection layer on the first dielectric layer and within the opening.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
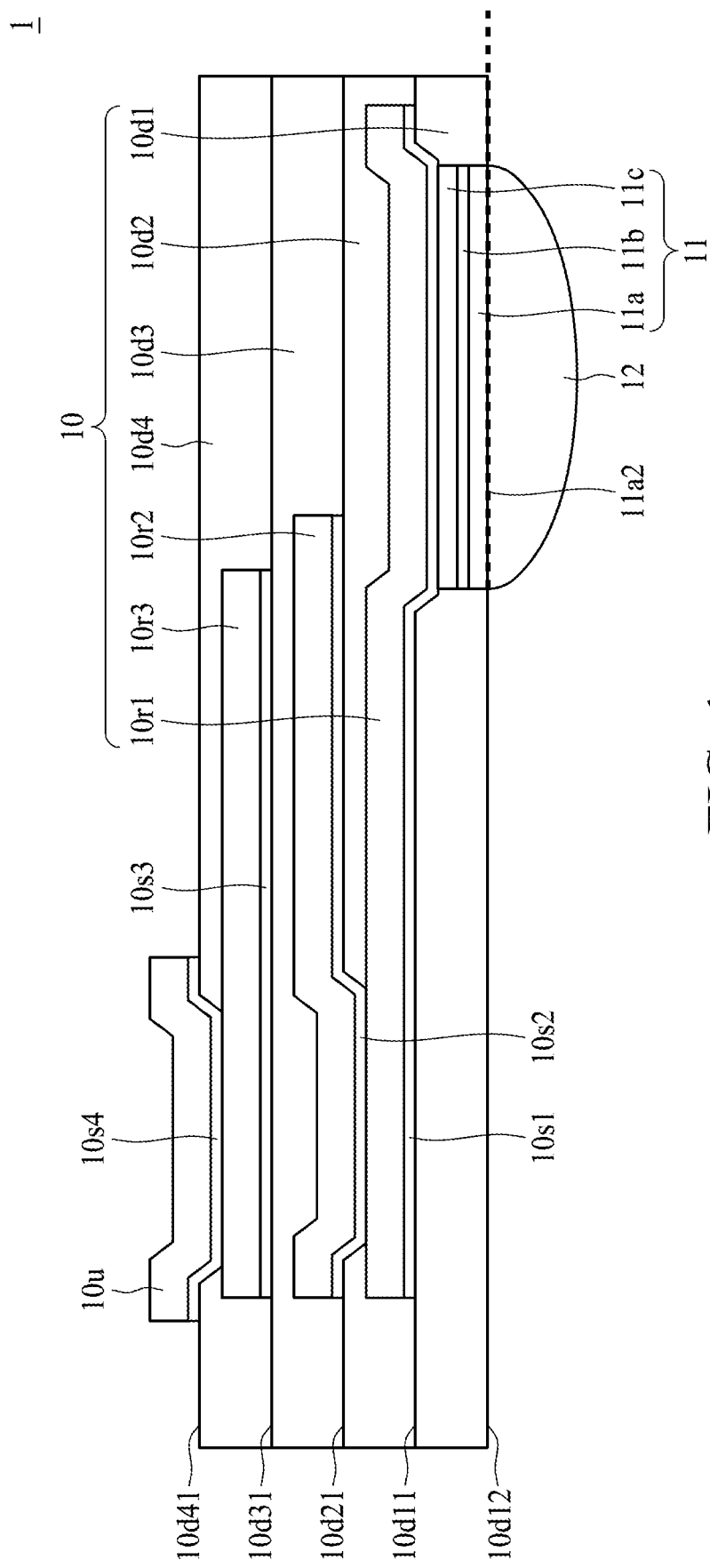
FIG. 1 illustrates a cross-sectional view of a semiconductor device package in accordance with some embodiments of the present disclosure.

FIG. 1 illustrates a cross-sectional view of a semiconductor device package 1 (or a portion of the semiconductor device package) in accordance with some embodiments of the present disclosure. The semiconductor package device 1 includes a circuit layer 10, a conductive pad 11 and an electrical contact 12.

The circuit layer 10 includes interconnection layers (e.g., redistribution layer, RDL) $10r1$, $10r2$, $10r3$, $10r4$ and dielectric layers $10d1$, $10d2$, $10d3$, $10d4$ (or passivation layers). A portion of the interconnection layers $10r1$, $10r2$, $10r3$, $10r4$ is covered or encapsulated by the dielectric layer $10d1$, $10d2$, $10d3$, $10d4$ while another portion of the interconnection layer $10r1$, $10r2$, $10r3$, $10r4$ is exposed from the dielectric layer $10d1$, $10d2$, $10d3$, $10d4$ to provide electrical connections.

As shown in FIG. 1, the interconnection layer $10r1$ is disposed on a surface $10d11$ of the dielectric layer $10d1$ and extending from the surface $10d11$ of the dielectric layer $10d1$ within the dielectric layer $10d1$ to electrically connect to the conductive pad 11. The dielectric layer $10d2$ is disposed on the surface $10d11$ of the dielectric layer $10d1$ and covers the interconnection layer $10r1$. In some embodiments, a seed layer $10s1$ may be disposed between the interconnection layer $10r1$ and the dielectric layer $10d1$, and between the interconnection layer $10r1$ and the conductive pad 11.

The interconnection layer 10r2 is disposed on a surface 10d21 of the dielectric layer 10d2 and extending from the surface 10d21 of the dielectric layer 10d2 within the dielectric layer 10d2 to electrically connect to the interconnection layer 10r1. The dielectric layer 10d3 is disposed on the surface 10d21 of the dielectric layer 10d2 and covers the interconnection layer 10r2. In some embodiments, a seed layer 10s2 may be disposed between the interconnection layer 10r2 and the dielectric layer 10d2, and between the interconnection layer 10r1 and the interconnection layer 10r2.

The interconnection layer 10r3 is disposed on a surface 10d31 of the dielectric layer 10d3. In some embodiments, the interconnection layer 10r3 may extend from the surface 10d31 of the dielectric layer 10d3 within the dielectric layer 10d3 to electrically connect to the interconnection layer 10r2. The dielectric layer 10d4 is disposed on the surface 10d31 of the dielectric layer 10d3 and covers the interconnection layer 10r3. In some embodiments, a seed layer 10s3 may be disposed between the interconnection layer 10r3 and the dielectric layer 10d3. In some embodiments, the seed layer 10s3 may be disposed between the interconnection layer 10r2 and the interconnection layer 10r3.

A conductive layer 10u (e.g., an under bump metallurgy (UBM) layer) is disposed on a surface 10d41 of the dielectric layer 10d4 and extending from the surface 10d41 of the dielectric layer 10d4 within the dielectric layer to electrically connect to the interconnection layer 10r3. In some embodiments, a seed layer 10s4 may be disposed between the conducive layer 10u and the dielectric layer 10d4, and between the interconnection layer 10r3 and the conductive layer 10u.

In some embodiments, the dielectric layers 10d1, 10d2, 10d3 and 10d4 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layers 10d1, 10d2, 10d3 and 10d4 may include an inorganic material, such as silicon, a ceramic or the like. In some embodiments, the interconnection layers 10r1, 10r2, 10r3 and the conductive layer 10u include copper (Cu), gold (Au), silver (Ag), another metal, or an alloy thereof. In some embodiments, the seed layers 10s1, 10s2, 10s3 and 10s4 include titanium (Ti) and/or Cu. In some embodiments, the circuit layer 10 may include any number of interconnection layers and dielectric layers depending on design specifications. For example, the circuit layer 10 may include N interconnection layers and M dielectric layers, where N and M are integers equal to or greater than 1.

The conductive pad 11 (or UMB layer) is disposed within the dielectric layer 10d1. The conductive pad 11 is electrically connected to the interconnection layer 10r1. In some embodiments, the conductive pad 11 is in contact with the seed layer 10s1. A lateral surface of the conductive pad 11 is encapsulated or covered by the dielectric layer 10d1. For example, the lateral surface of the conductive pad 11 is in contact with the dielectric layer 10d1. A surface 11a2 of the conductive pad 11 is exposed from the dielectric layer 10d1.

In some embodiments, the surface 11a2 of the conductive pad 11 is substantially coplanar with the surface 10d12 of the dielectric layer 10d1. In other embodiments, the surface 11a2 of the conductive pad 11 may be recessed from the surface 10d12 of the dielectric layer 10d1, and a depth of the recess is in a range from about 0.1 micrometer (μm) to about 0.2 μm. In some embodiments, a thickness of the conductive pad 11 is less than a thickness of the dielectric layer 10d1.

In some embodiments, the conductive pad 11 includes conductive layers 11a, 11b and 11c. The conductive layer 11a is in contact with the interconnection layer 10r1 or the seed layer 10s1. The conductive layer 11b is in contact with the conductive layer 11a. The conductive layer 11c is in contact with the conductive layer 11b. As shown in FIG. 1, the conductive layer 11b is disposed between the conductive layer 11a and the conductive layer 11c. For example, the conductive layer 11b is sandwiched by the conductive layer 11a and the conductive layer 11c. In some embodiments, the conductive layers 11a, 11b and 11c include the same width. Alternatively, the conductive layers 11a, 11b and 11c may include different widths depending on different design specifications.

In some embodiments, the conductive layer 11a and the conductive layer 11c include Cu, Ag, Au, another metal, or an alloy thereof. The conductive layer 11a and the conductive layer 11c may include the same or different materials depending on different design specifications. In some embodiments, the conductive layer 11b includes nickel (Ni), titanium tungsten (TiW), another metal, or an alloy thereof. In some embodiments, a thickness of the conductive layer 11b is equal to or greater than 2 μm. In some embodiments, the conductive layer 11b is provided as a barrier layer (or stop layer) to eliminate the formation of an IMC layer between the electrical contact 12 and the conductive layer 11c.

In some embodiments, the barrier layer (e.g., the conductive layer 11b) is omitted, and a solder ball is electrically connected to the Cu pad. In this case, an IMC layer may be formed at an interface (or boundary) between the solder ball and the Cu pad and extends within the Cu pad. If the thickness of the Cu pad is insufficient, the IMC layer would extend to the entire Cu pad, which would lead to a crack or void and in turn affect the connection between the solder ball and the Cu pad. In some embodiments, the above IMC issue may be eliminated or reduced by increasing the thickness of the Cu pad. However, this will increase the thickness of the semiconductor package and hinder the miniaturization of the semiconductor package.

In accordance with the embodiments as shown in FIG. 1, the conductive pad 11 (including the barrier layer (e.g., the conductive layer 11b) sandwiched by the conductive layers 11a and 11c) is electrically connected to the electrical contact 12 (e.g., solder ball). Even if an IMC layer may be formed at an interface (or boundary) between the conductive layer 11a and the electrical contact 12 and extends within the conductive layer 11a, the extension of the IMC layer would be blocked or stopped by the conductive layer 11b. For example, the conductive layer 11b can prevent the IMC layer from extending into the conductive layer 11c, so as to avoid the crack or void and to strengthen the connection between the conductive pad 11 and the electrical contact 12.

In addition, since the conductive pad 11 (e.g., UMB) is embedded within the dielectric layer 10d1, the lateral surface of the conductive pad 11 is protected by the dielectric layer 10d1. Hence, the conductive pad 11 has a relative better connection strength compared with a conductive pad disposed on or exposed from the dielectric layer 10d1.

Furthermore, compared with the formation of the conductive pad on the dielectric layer, forming the conductive pad 11 within the dielectric layer 10d1 as shown in FIG. 1 will save 1 photoresist during the manufacturing process, which would reduce the manufacturing cost and time.

The electrical contact 12 (e.g. a solder ball) is disposed on the conductive pad 11 (e.g., on the conductive layer 11a of the conductive pad 11) and can provide electrical connections between the semiconductor device package 1 and external components (e.g. external circuits or circuit boards). In some embodiments, the electrical contact 12 includes a controlled collapse chip connection (C4) bump, a ball grid array (BGA) or a land grid array (LGA).

In some embodiments, one or more electronic components (active component or passive component) may be disposed on the circuit layer 10 and electrically connected to the circuit layer 10 (e.g., to the conductive layer 10u). In some embodiments, a molding compound may be disposed on the circuit layer 10 and covering the electronic components and the conductive layer 10u. In some embodiments, the semiconductor device package 1 in FIG. 1 can be connected or mounted to another circuit board through the electrical contact 12.

FIG. 2A, FIG. 2B, FIG. 2C, FIG. 2D, FIG. 2E, FIG. 2F, FIG. 2G, FIG. 2H, FIG. 2I and FIG. 2J are cross-sectional views of a semiconductor structure fabricated at various stages, in accordance with some embodiments of the present disclosure. At least some figures have been simplified for a better understanding of the aspects of the present disclosure.

Figure 2A:
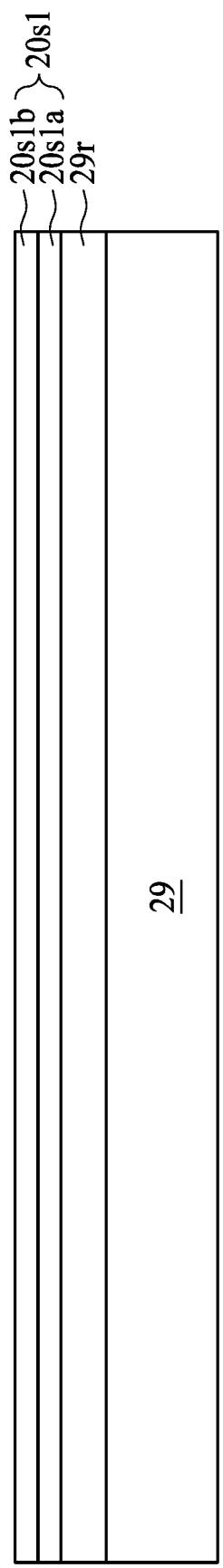
FIG. 2A illustrates one or more stages of a method of manufacturing a semiconductor package device in accordance with some embodiments of the present disclosure.

Referring to FIG. 2A, a carrier 29 is provided. The carrier 29 has an adhesion layer 29r (or release film) thereon. A seed layer 20s1 is formed on or attached to the adhesion layer 29r. In some embodiments, the seed layer 20s1 includes a Ti layer 20s1a and a Cu layer 20s1b (e.g., Ti/Cu alloy) or other suitable materials. In some embodiments, the seed layer 20s1 may be formed by physical vapor deposition (PVD) or other suitable processes.

Figure 2B:
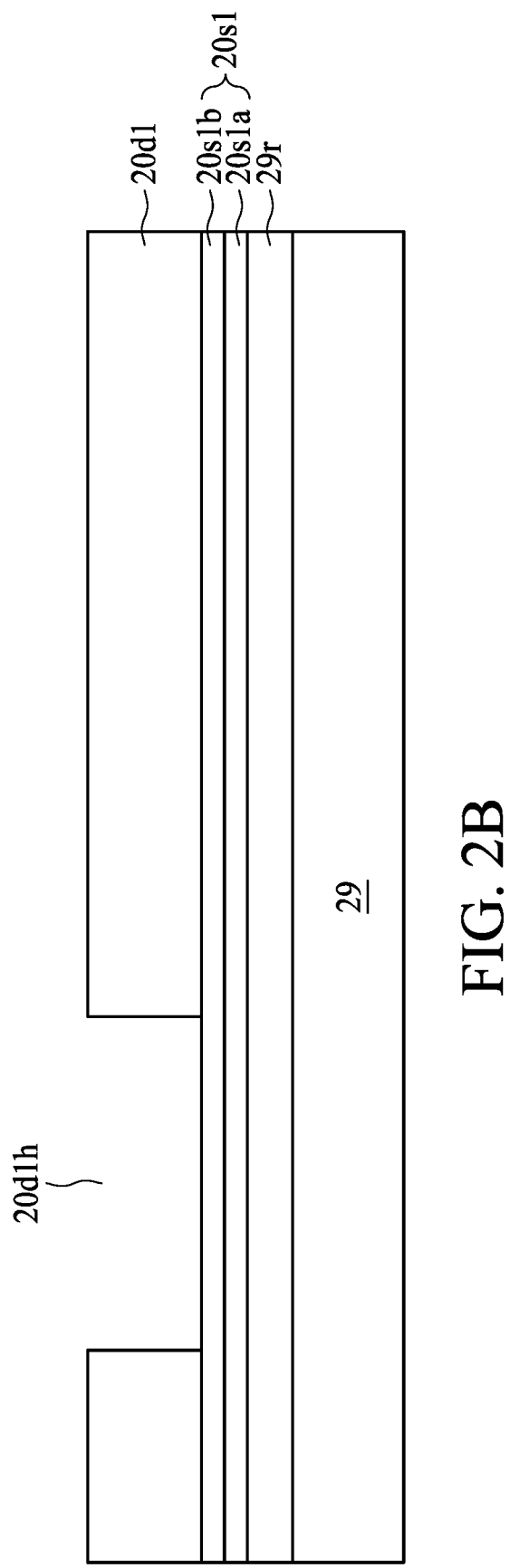
FIG. 2B illustrates one or more stages of a method of manufacturing a semiconductor package device in accordance with some embodiments of the present disclosure.

Referring to FIG. 2B, a dielectric layer 20d1 (or passivation layer) is formed on the seed layer 20s1. An opening 20d1h is formed to expose a portion of the seed layer 20s1. In some embodiments, the opening 20d1h can be formed by, for example, etching, laser or any other suitable processes. In some embodiments, the dielectric layer 20d1 is the same as or similar to the dielectric layer 10d1 in FIG. 1, and the dielectric layer 20d1 and the dielectric layer 10d1 may include the same properties.

Figure 2C:
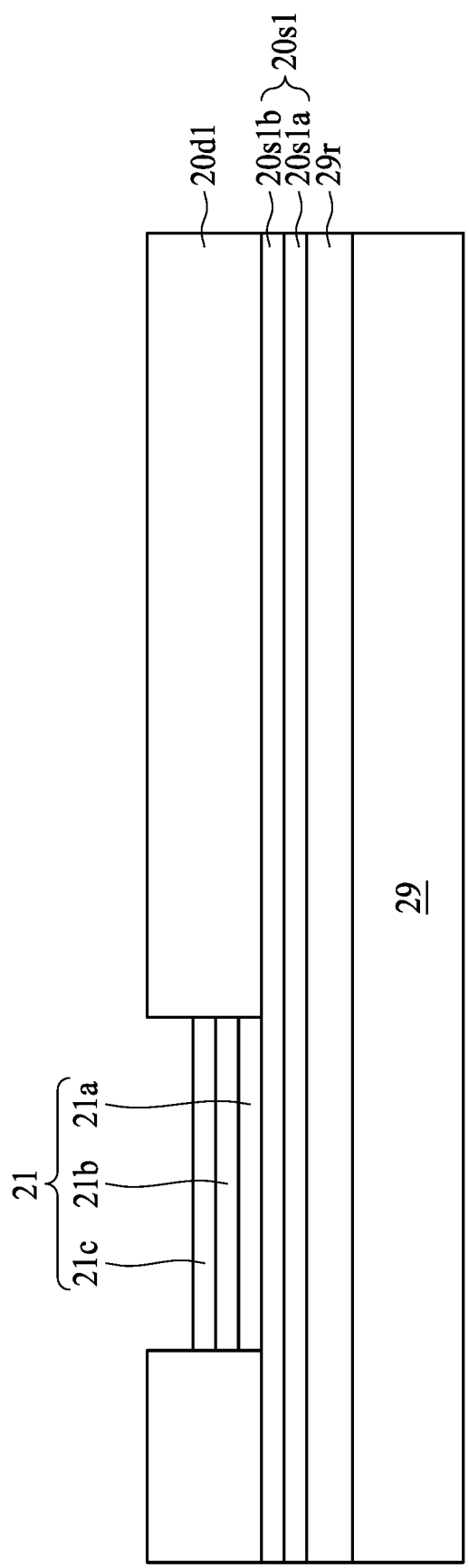
FIG. 2C illustrates one or more stages of a method of manufacturing a semiconductor package device in accordance with some embodiments of the present disclosure.

Referring to FIG. 2C, a conductive pad 21 is formed within the opening 20d1h and on the seed layer 20s1. In some embodiments, the conductive pad 21 (or UMB layer) includes conductive layers 21a, 21b and 21c. In some embodiments, the conductive layer 21a is formed on the seed layer 20s1, the conductive layer 21b is formed on the conductive layer 21a, and then the conductive layer 21c is formed on the conductive layer 21b. In some embodiments, a thickness of the conductive pad 21 is less than a depth of the opening 20d1h. In some embodiments, the conductive layers 21a, 21b and 21c are formed by, for example, plating or any other suitable processes.

In some embodiments, the conductive layer 21a and the conductive layer 21c include Cu, Ag, Au, another metal, or an alloy thereof. In some embodiments, the conductive layer 21b includes Ni, TiW, another metal, or an alloy thereof. In some embodiments, a thickness of the conductive layer 11b is equal to or greater than 2 μm. In some embodiments, the conductive layers 21a, 21b and 21c are respectively the same as or similar to the conductive layers 11a, 11b and 11c in FIG. 1, and the conductive layers 21a, 21b and 21c and the conductive layers 11a, 11b and 11c may include the same properties.

Figure 2D:
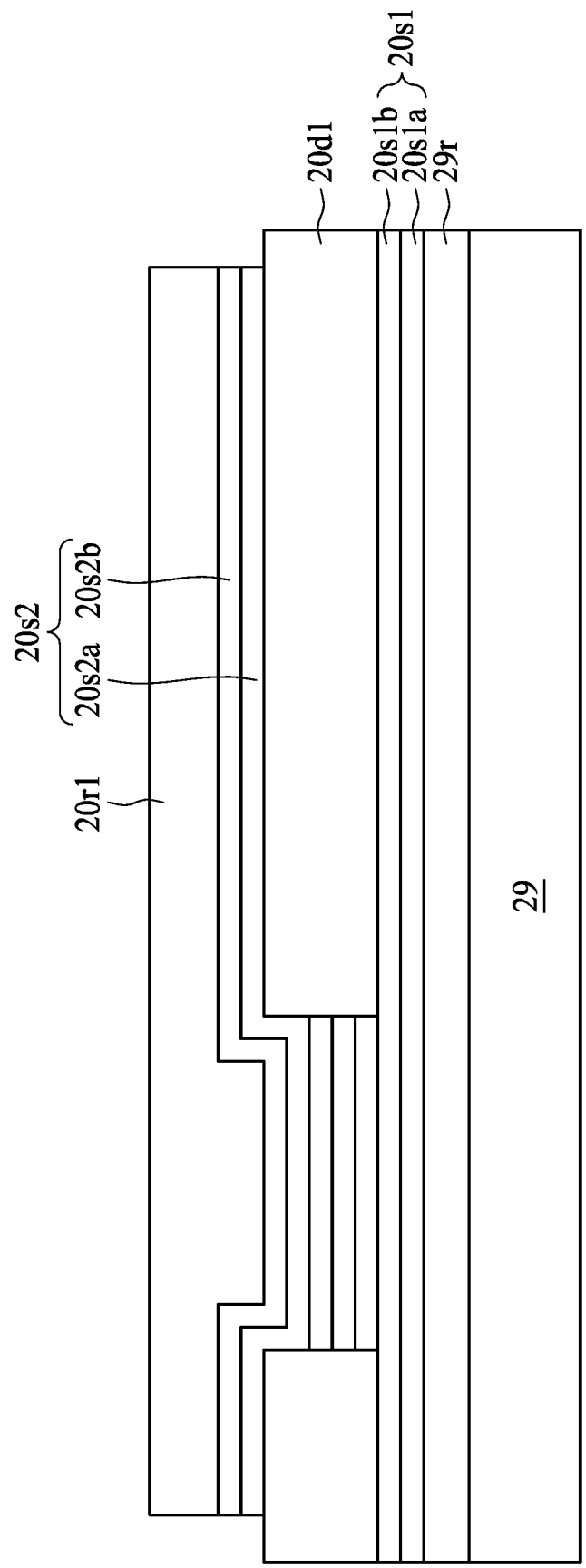
FIG. 2D illustrates one or more stages of a method of manufacturing a semiconductor package device in accordance with some embodiments of the present disclosure.

Referring to FIG. 2D, a seed layer 20s2 is formed on the dielectric layer 20d1. The seed layer 20s2 is also formed within the opening 20d1h and on the conductive pad 21 (e.g., on the conductive layer 21c of the conducive pad 21). In some embodiments, the seed layer 20s2 includes a Ti layer 20s2a and a Cu layer 20s2b (e.g., Ti/Cu alloy) or other suitable materials. In some embodiments, the seed layer 20s2 may be formed by PVD or other suitable processes. An interconnection layer 20r1 (e.g., RDL) is then formed on the seed layer 20s2 by, for example, plating or any other suitable processes.

Figure 2E:
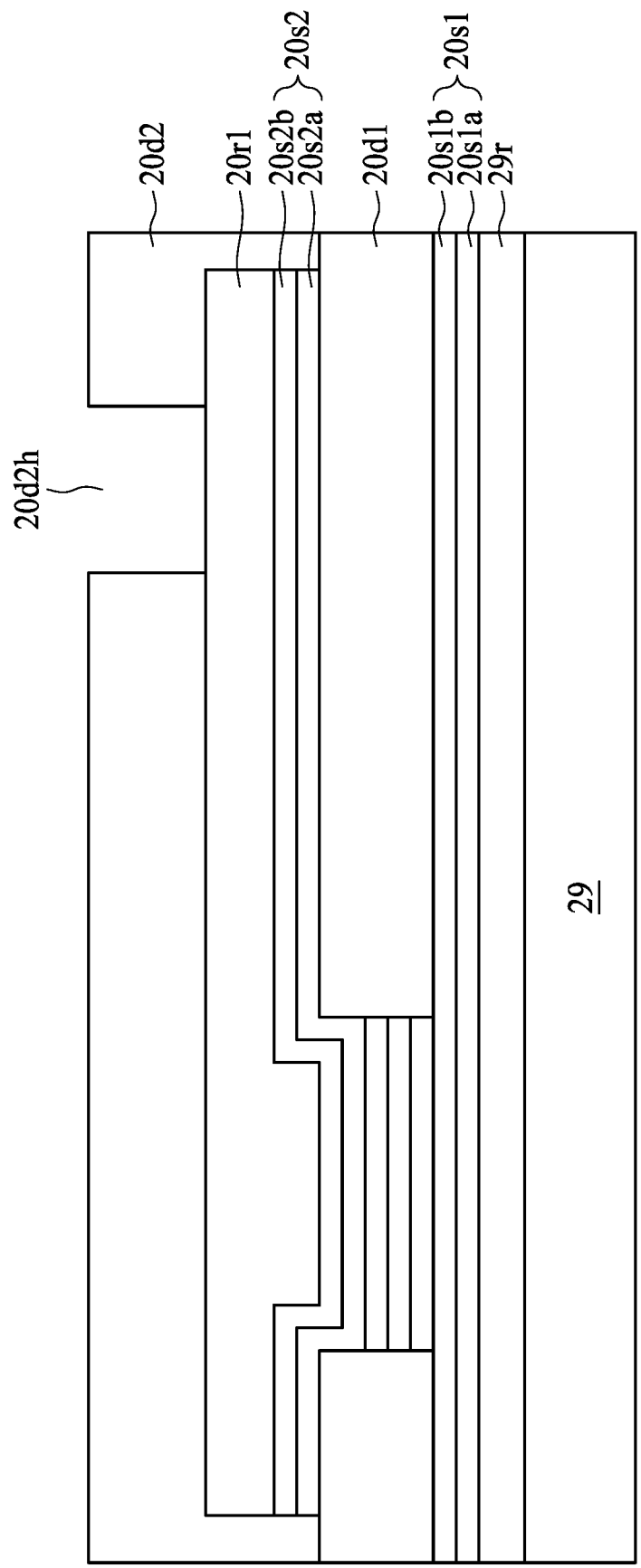
FIG. 2E illustrates one or more stages of a method of manufacturing a semiconductor package device in accordance with some embodiments of the present disclosure.

Referring to FIG. 2E, a dielectric layer 20d2 (or passivation layer) is formed on the dielectric layer 20d1 to cover the interconnection layer 20r1. An opening 20d2h is formed to expose a portion of the interconnection layer 20r1. In some embodiments, the opening 20d2h can be formed by, for example, etching, laser or any other suitable processes. In some embodiments, the dielectric layer 20d2 is the same as or similar to the dielectric layer 10d2 in FIG. 1, and the dielectric layer 20d2 and the dielectric layer 10d2 may include the same properties.

Referring to FIG. 2E, a seed layer 20s3 is formed on the dielectric layer 20d2. The seed layer 20s3 is also formed within the opening 20d2h and on the interconnection layer 20r1. In some embodiments, the seed layer 20s3 includes a Ti layer 20s3a and a Cu layer 20s3b (e.g., Ti/Cu alloy) or other suitable materials. In some embodiments, the seed layer 20s3 may be formed by PVD or other suitable processes. An interconnection layer 20r2 (e.g., RDL) is then formed on the seed layer 20s3 by, for example, plating or any other suitable processes.

Figure 2F:
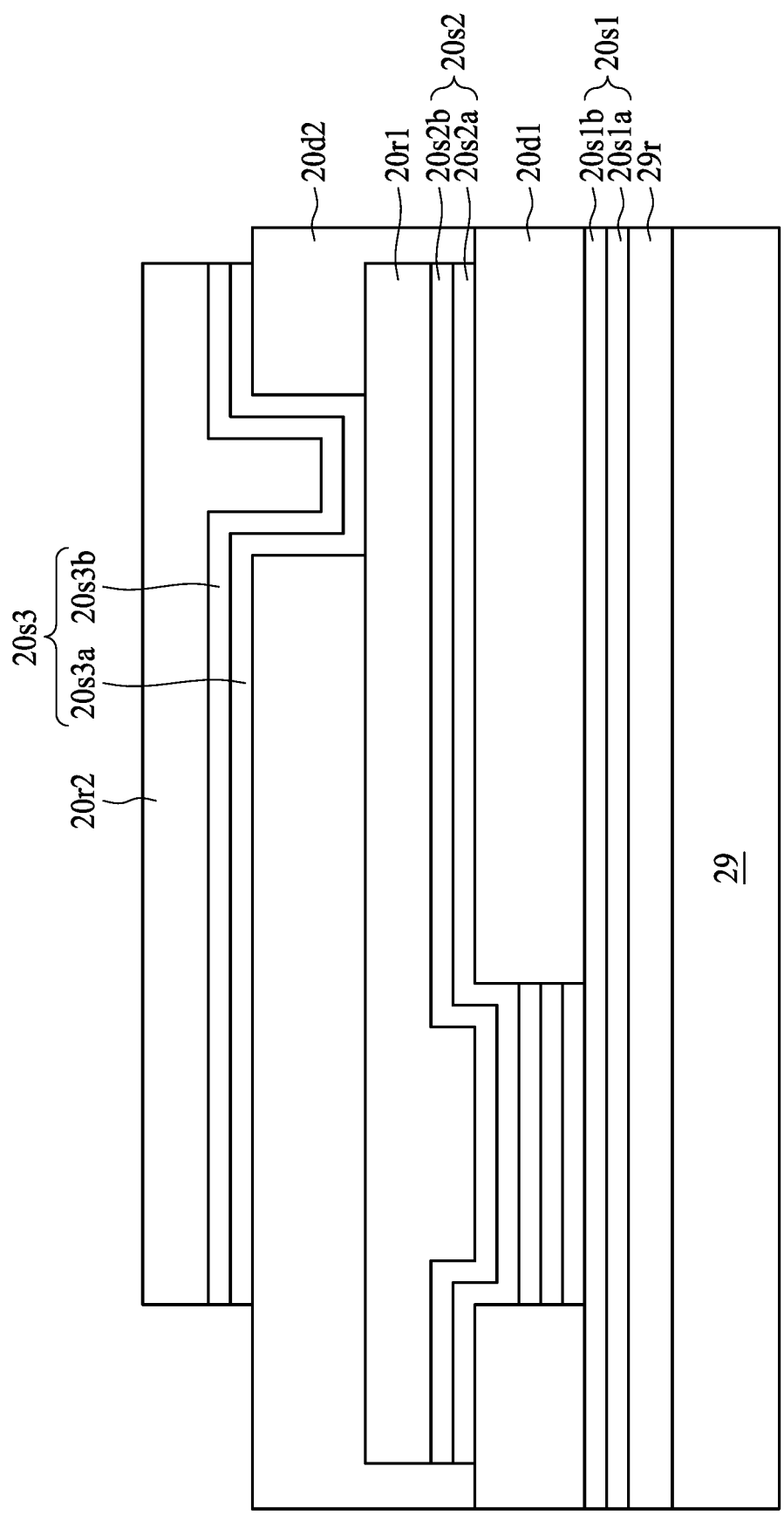
FIG. 2F illustrates one or more stages of a method of manufacturing a semiconductor package device in accordance with some embodiments of the present disclosure.
Figure 2G:
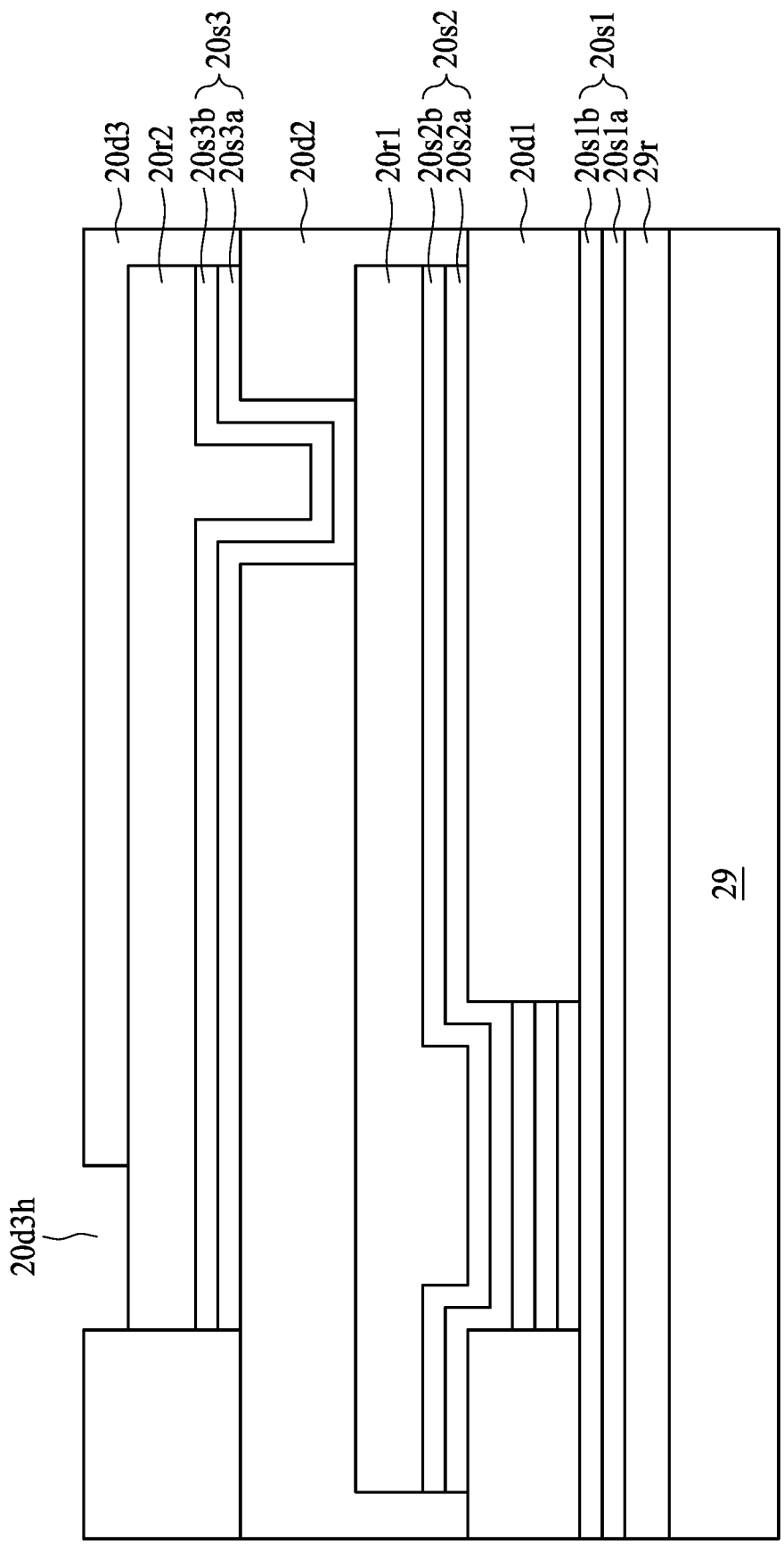
FIG. 2G illustrates one or more stages of a method of manufacturing a semiconductor package device in accordance with some embodiments of the present disclosure.

Referring to FIG. 2F, a dielectric layer 20d3 (or passivation layer) is formed on the dielectric layer 20d2 to cover the interconnection layer 20r2. An opening 20d3h is formed to expose a portion of the interconnection layer 20r2. In some embodiments, the opening 20d3h can be formed by, for example, etching, laser or any other suitable processes. In some embodiments, the dielectric layer 20d3 is the same as or similar to the dielectric layer 10d3 in FIG. 1, and the dielectric layer 20d3 and the dielectric layer 10d3 may include the same properties.

Figure 2H:
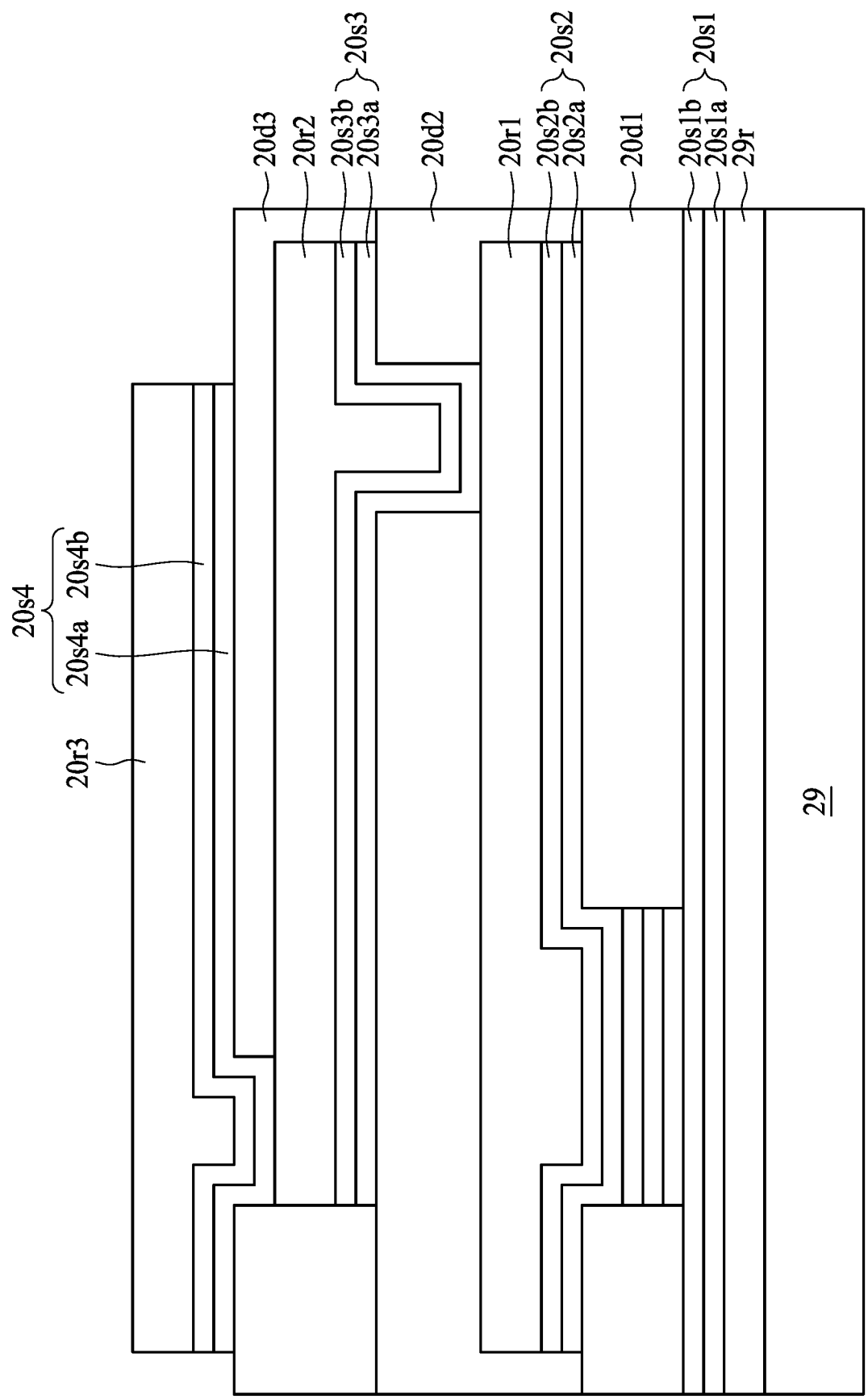
FIG. 2H illustrates one or more stages of a method of manufacturing a semiconductor package device in accordance with some embodiments of the present disclosure.

Referring to FIG. 2H, a seed layer 20s4 is formed on the dielectric layer 20d3. The seed layer 20s4 is also formed within the opening 20d3h and on the interconnection layer 20r2. In some embodiments, the seed layer 20s4 includes a Ti layer 20s4a and a Cu layer 20s4b (e.g., Ti/Cu alloy) or other suitable materials. In some embodiments, the seed layer 20s4 may be formed by PVD or other suitable processes. An interconnection layer 20r3 (e.g., RDL) is then formed on the seed layer 20s4 by, for example, plating or any other suitable processes.

Figure 2I:
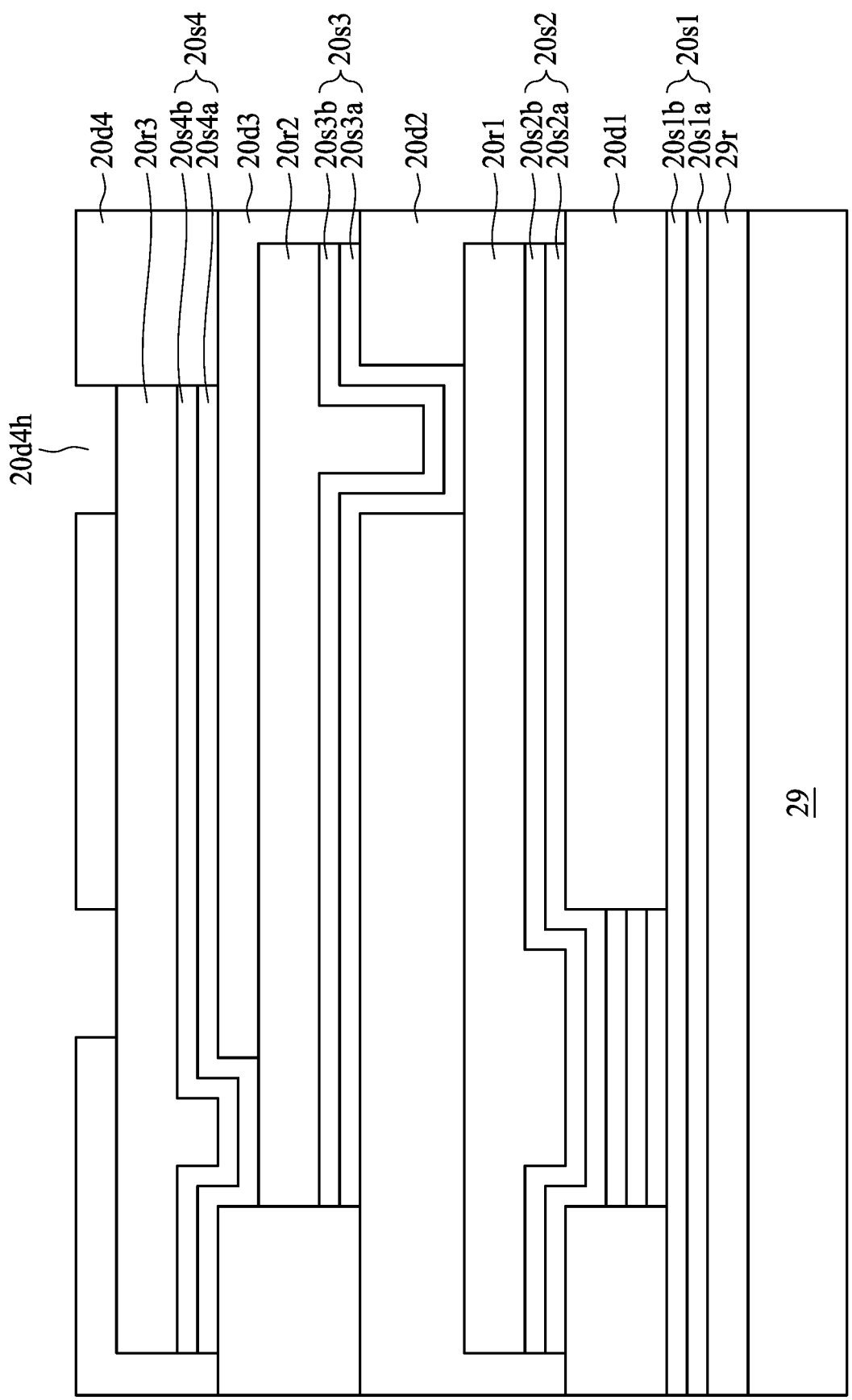
FIG. 2I illustrates one or more stages of a method of manufacturing a semiconductor package device in accordance with some embodiments of the present disclosure.
Figure 2J:
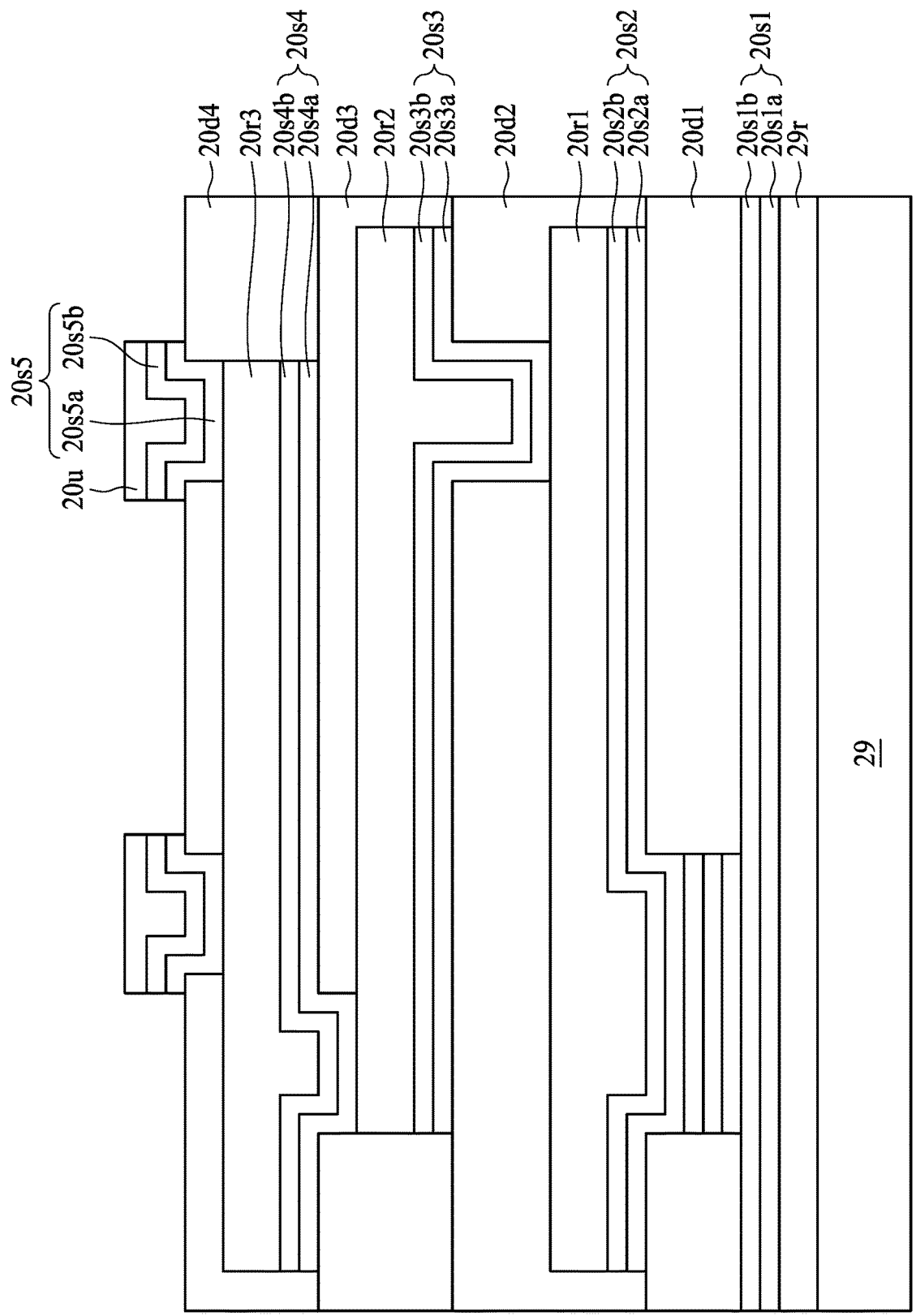
FIG. 2J illustrates one or more stages of a method of manufacturing a semiconductor package device in accordance with some embodiments of the present disclosure.

Referring to FIG. 2I, a dielectric layer 20d4 (or passivation layer) is formed on the dielectric layer 20d3 to cover the interconnection layer 20r3. An opening 20d4h is formed to expose a portion of the interconnection layer 20r3. In some embodiments, the opening 20d4h can be formed by, for example, etching, laser or any other suitable processes. In some embodiments, the dielectric layer 20d4 is the same as or similar to the dielectric layer 10d4 in FIG. 1, and the dielectric layer 20d4 and the dielectric layer 10d4 may include the same properties.

Referring to FIG. 2I, a seed layer 20s5 is formed on the dielectric layer 20d4. The seed layer 20s5 is also formed within the opening 20d4h and on the interconnection layer 20r3. In some embodiments, the seed layer 20s5 includes a Ti layer 20s5a and a Cu layer 20s5b (e.g., Ti/Cu alloy) or other suitable materials. In some embodiments, the seed layer 20s5 may be formed by PVD or other suitable processes. A conductive layer 20u (e.g., UMB layer) is then formed on the seed layer 20s5 by, for example, plating or any other suitable processes.

Then, the carrier 29 and the release film 29r are removed from the seed layer 20s1, and the seed layer 20s1 (including the Ti layer 20s1a and the Cu layer 20s1b) is removed to expose the conductive pad 21 (e.g., the conductive layer 21a of the conductive pad 21). In some embodiments, the seed layer 20s1 can be removed by, for example, etching or any other suitable processes. In some embodiments, after the seed layer 20s1 is removed, the exposed portion of the conductive layer 21a of the conductive pad 21 is substantially coplanar with a bottom surface of the dielectric layer 20d1. In other embodiments, when performing an etching operation to remove the seed layer 20s1, a portion of the conductive layer 21a of the conductive pad 21 may be removed as well. In this case, the conductive layer 21a of the conductive pad 21 may be recessed from a bottom surface of the dielectric layer 20d1. In some embodiments, a depth of the recess is in a range from about 0.1 µm to about 0.2 µm.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a circuit pattern layer including a bottom surface, the circuit pattern layer comprising:
        a first dielectric layer having a first opening, and
        a conductive pad disposed in the first opening;
    an electrical contact disposed on the bottom surface of the circuit pattern layer and in contact with the conductive pad;
    an intermetallic compound (IMC) layer located between the conductive pad and the electrical contact,
    a first seed layer disposed on the first dielectric layer, wherein the first seed layer includes a first recess portion tapering to the bottom surface of the circuit pattern layer; and
    an interconnection layer disposed on the first seed layer, wherein the interconnection layer includes a bottom surface contacting the seed layer and a top surface opposite to the bottom surface of the interconnection layer, and wherein the top surface of the interconnection layer includes a second recess portion tapering to the bottom surface of the circuit pattern layer,
    wherein an imaginary line extending from the bottom surface of the circuit pattern layer passes through the IMC layer from a cross-sectional view.

2. The semiconductor device package of claim 1, wherein the circuit pattern layer includes a redistribution layer (RDL).

3. The semiconductor device package of claim 1, wherein the conductive pad includes a barrier layer, and wherein a portion of the IMC layer is located between the imaginary line and the barrier layer.

4. The semiconductor device package of claim 1, further comprising a seed layer disposed on the first dielectric layer, wherein the seed layer includes a first recess portion tapering to the bottom surface of the circuit pattern layer,
  wherein the conductive pad includes a barrier layer, and wherein a portion of the IMC layer is located between the imaginary line and the barrier layer,
  wherein a first width of the first opening adjacent to a top surface of the circuit pattern layer is greater than a second width of the first opening adjacent to the bottom surface of the circuit pattern layer,
  wherein the circuit pattern layer further comprises a second dielectric layer disposed over the first dielectric layer, the second dielectric layer having a second opening,
  wherein a third width of the second opening adjacent to the top surface of the circuit pattern layer is greater than a fourth width of the second opening adjacent to the bottom surface of the circuit pattern layer, and wherein the first width is greater than the fourth width of the second opening, and
  wherein the circuit pattern layer includes a RDL.

5. The semiconductor device package of claim 3,
  wherein the barrier layer includes a first surface and a second surface opposite to the first surface, and the conductive pad includes a first conductive layer on the first surface of the barrier layer and a second conductive layer on the second surface of the barrier layer, and
  wherein the first conductive layer includes a first conductive material and the second conductive layer includes a second conductive material same as the first conductive material.

6. The semiconductor device package of claim 5, wherein the first conductive layer, the barrier layer, and the second conductive layer has a substantially equal width, respectively.

7. The semiconductor device package of claim 5, wherein the IMC layer is located between the first conductive layer and an electrical contact, and the second conductive layer is in contact with a seed layer.

8. A semiconductor device package, comprising:
  a circuit pattern layer including a bottom surface, the circuit pattern layer comprising:
    a first dielectric layer having a first opening, and
    a conductive pad disposed in the first opening;
  an electrical contact disposed on the bottom surface of the circuit pattern layer and in contact with the conductive pad; and
  an intermetallic compound (IMC) layer located between the conductive pad and the electrical contact,
  wherein an imaginary line extending from the bottom surface of the circuit pattern layer passes through the IMC layer from a cross-sectional view,
  wherein a first width of the first opening adjacent to a top surface of the circuit pattern layer is greater than a second width of the first opening adjacent to the bottom surface of the circuit pattern layer,
  wherein the circuit pattern layer further comprises a second dielectric layer disposed over the first dielectric layer, the second dielectric layer having a second opening, wherein a third width of the second opening adjacent to the top surface of the circuit pattern layer is greater than a fourth width of the second opening adjacent to the bottom surface of the circuit pattern layer, and wherein the first width is greater than the fourth width.

9. The semiconductor device package of claim 8, wherein the first width is greater than the third width.

10. The semiconductor device package of claim 8, wherein the circuit pattern layer further comprises a second seed layer disposed on the second dielectric layer, and wherein the second seed layer includes a third recess portion tapering to the bottom surface of the circuit pattern layer.

11. The semiconductor device package of claim 10, wherein the circuit pattern layer further comprises a second interconnection layer disposed on the second seed layer, and the second interconnection layer includes a bottom surface contacting the second seed layer and a top surface opposite to the bottom surface of the second interconnection layer, and
  wherein the top surface of the second interconnection layer includes a fourth recess portion tapering to the bottom surface of the circuit pattern layer.

12. A semiconductor device package, comprising:
  a circuit pattern layer including a top surface and a bottom surface opposite to the top surface, the circuit pattern layer comprising:
    a first dielectric layer having a first opening, wherein a first width of the first opening adjacent to the top surface of the circuit pattern layer is greater than a second width of the first opening adjacent to the bottom surface of the circuit pattern layer;
  an under bump metallurgy (UBM) layer disposed on the top surface of the circuit pattern layer, the UBM layer including a top surface with a third width, wherein the first width is greater than the third width.

13. The semiconductor device package of claim 12, wherein the UBM layer includes a recess portion, and a level of top surface of the recess portion of the UBM layer is higher than a level of the top surface of the circuit pattern layer.

14. The semiconductor device package of claim 12, further comprising a first interconnection layer disposed on the first dielectric layer and a second interconnection layer disposed over the first interconnection layer,
  wherein the circuit pattern layer comprises a conductive pad disposed in the first opening and including a bottom surface adjacent to the bottom surface of the circuit pattern layer,
  wherein the first interconnection layer includes a first sidewall and a second sidewall opposite to the first sidewall, and the first sidewall of the first interconnection layer is closer to the conductive pad than the second sidewall of the first interconnection layer is,
  wherein the second interconnection layer includes a third sidewall and a fourth sidewall opposite to the third sidewall, and the third sidewall of the second interconnection layer is closer to the conductive pad than the fourth sidewall of the second interconnection layer is, and
  wherein the second sidewall of the first interconnection layer and the fourth sidewall of the second interconnection layer are substantially aligned, and a first distance between the first sidewall and the second sidewall of the first interconnection layer is greater than a second distance between the third sidewall and the fourth sidewall of the second interconnection layer.

15. The semiconductor device package of claim 12, wherein the first opening has a first portion with an inclined sidewall and a second portion with a vertical sidewall, and the first portion is closer to the top surface of the circuit pattern layer than the second portion is, and wherein the inclined sidewall of the first portion is in contact with the vertical sidewall of the second portion.

16. The semiconductor device package of claim 14, further comprising a third interconnection layer disposed over the second interconnection layer,
  wherein the third interconnection layer includes a fifth sidewall and a sixth sidewall opposite to the fifth sidewall, and the fifth sidewall of the third interconnection layer is closer to the conductive pad than the sixth sidewall of the third interconnection layer is, and
  wherein the fourth sidewall of the second interconnection layer and the sixth sidewall of the third interconnection layer are substantially aligned, and the second distance between the third sidewall and the fourth sidewall of the second interconnection layer is greater than a third distance between the fifth sidewall and the sixth sidewall of the third interconnection layer.

17. The semiconductor device package of claim 15, wherein the conductive pad is accommodated within the second portion of the first opening.

18. The semiconductor device package of claim 16, wherein a first horizontal distance between the first sidewall of the first interconnection layer and the third sidewall of the second interconnection layer is greater than a second horizontal distance between the third sidewall of the second interconnection layer and the fifth sidewall of the third interconnection layer.

* * * * *